United States Patent

[11] 3,633,202

[72] Inventors Paul A. Kuckein
Burlingame;
Francis E. Mueller, San Jose, both of Calif.
[21] Appl. No. 889,444
[22] Filed Dec. 31, 1969
[45] Patented Jan. 4, 1972
[73] Assignee International Business Machines Corporation
Armonk, N.Y.

[54] SELF-CALIBRATING ANALOG-TO-DIGITAL CONVERTER
6 Claims, 1 Drawing Fig.

[52] U.S. Cl. .................................................... 340/347AD, 324/130
[51] Int. Cl. .................................................... H03k13/02, H03k 13/20, G01r 1/02
[50] Field of Search .......................................... 340/347 AD, 347 DD; 235/92; 324/130

[56] References Cited

UNITED STATES PATENTS

| | | | |
|---|---|---|---|
| 3,064,247 | 11/1962 | Lang | 340/347 AD |
| 3,354,452 | 11/1967 | Bard et al. | 340/347 AD |
| 3,555,298 | 1/1971 | Neelands | 340/347 AD X |
| 2,950,471 | 8/1960 | Hoeppner | 340/347 |
| 3,304,415 | 2/1967 | Connolly et al. | 235/92 |
| 3,350,708 | 10/1967 | Adler | 340/347 |
| 3,460,035 | 8/1969 | Louvel | 324/130 X |
| 3,500,196 | 3/1970 | Cooper | 324/130 X |

*Primary Examiner*—Maynard R. Wilbur
*Assistant Examiner*—Michael K. Wolensky
*Attorneys*—Hanifin and Jancin and Otto Schmid, Jr.

ABSTRACT: The method and apparatus for providing a self-calibrating ADC of the type which utilizes a voltage controlled oscillator in conjunction with a counting register to translate an analog signal into time domain. A second counting register, a fixed frequency pulse source, and zero and full scale reference voltages are used to generate span and zero calibration factors to any desired accuracy.

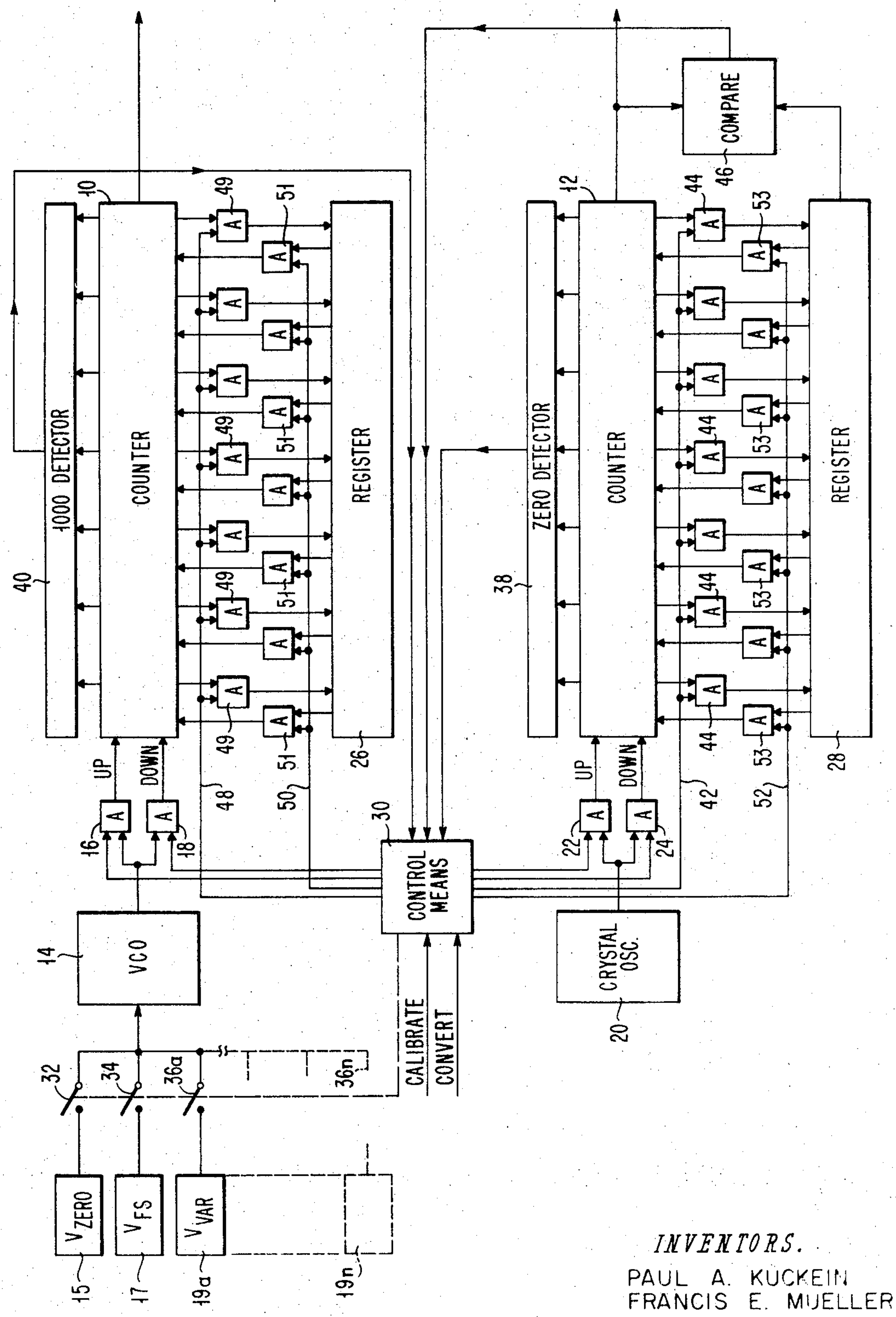
INVENTORS.
PAUL A. KUCKEIN
FRANCIS E. MUELLER
BY Otto Schmid, Jr
ATTORNEY

SELF-CALIBRATING ANALOG-TO-DIGITAL CONVERTER

BACKGROUND OF THE INVENTION

This invention relates to a method and means for producing a digital representation of an applied analog signal and more particularly to a method and apparatus for providing a self-calibrating analog-to-digital converter.

The rapid expansion of low-cost digital data processing equipment into the area of process control and data acquisition systems has created a need for low-cost systems for the conversion of analog data to digital data for use in these systems. Analog-to-digital converters have been used which utilize pulse-counting techniques to obtain the digital representation for an analog input signal. However, one disadvantage inherent in these pulse-counting techniques is that the accuracy of the digital indication is limited by the grain and drift characteristic of the voltage-controlled oscillator or other voltage-to-time converter. Since high accuracy is usually a requirement of these systems, it is necessary to provide calibration factors along with measured data to be combined in a later operation. This requirement has limited the use of such analog-to-digital converters since the use of a calibration factor is often inconvenient. It is a primary object of this invention to provide an analog-to-digital converter that is self-calibrating and which can be calibrated to operate at any desired accuracy within the theoretical limits of the system.

SUMMARY OF THE INVENTION

Briefly, according to the invention, there is provided a method and apparatus for generating a digital representation of an analog signal of unknown magnitude utilizing a first counting means selective actuable to count pulses from a pulse-generating means having a variable controlled repetition rate and a second counting means which is selectively actuable to count pulses from a pulse-generating means having a fixed repetition rate. A conversion is accomplished by storing the span calibration factor into the second counting means and the zero calibration factor into the first counting means and counting the first counting means up until the second counting means is counted down to a reference count. The span calibration factor is generated by storing a count indicative of a nominal span calibration, producing pulses having a variable repetition rate in response to a first reference voltage, connecting the pulses to count the pulses in the first counting means in a first direction for a fixed time, producing pulses having a variable repetition rate in response to a second reference voltage, connecting the pulses to the first counting means to count to a predetermined count as the second counting means is counted at a fixed rate, comparing the nominal count and the actual count, and repeating the above procedure until the two values are the same within the desired accuracy to provide a span calibration factor. The zero calibration factor is generated by counting the first counting means down while the first reference signal is applied for the time it takes the second counting means to count to a reference count from the span calibration count so that the resulting count in the first counting means is the zero calibration factor.

BRIEF DESCRIPTION OF THE DRAWING

The drawing is a schematic block diagram of the analog-to-digital converter embodying the invention.

DESCRIPTION OF THE PREFERRED EMBODIMENT

In the embodiment of the invention shown in the drawing, the analog-to-digital converter comprises a first counting means 10 and second counting means 12. A pulse-producing means 14 is provided to supply pulses to counting means 10 through selectively operated gating means 16, 18. Pulse-producing means 14 produces pulses having a variable repetition rate dependent upon the voltage coupled to the input of pulse-producing means 14 and this input is selectable from first reference voltage source 15, second reference voltage source 17 or one of the analog signals 19*a* . . . 19*n* of unknown amplitude. An accurately controlled clock pulse-generating means 20 is provided and the output pulses are connected to counting means 12 selectively through gating means 22, 24. A register means 26 is connected for transferring data to or from counting means 10 and a second register means 28 is connected for transfer of information with counting means 12. Control means 30 are provided to generate the necessary control signals for actuating the proper gating means at the proper time in the operation of the ADC.

When the system is properly calibrated in a manner to be discussed below a span calibration factor is stored in register means 28 and a zero offset factor is stored in register 26. At the beginning of a conversion operation the zero offset factor is transferred into counting means 10 and the span calibration factor is transferred into counting means 12. The analog signal of unknown amplitude is then connected to the input of pulse-producing means 14. The output of pulse-producing means 14 is connected to count-counting means 10 in a first direction and simultaneously the input of clock pulse-producing means 20 is connected to count-counting means 12 in the opposite direction. This operation continues until counting means 12 reaches a predetermined count at which time the count then in counting means 10 is a digital representation of the amplitude of the analog signal.

Pulse-producing means 14 produces a series of output pulses having a variable repetition rate dependent upon the amplitude of the unknown signal. Pulse-producing means 14 may comprise any suitable device. In the embodiment of the invention shown in the drawings, the pulse-producing means 14 comprises a voltage-controlled oscillator (VCO) which has the characteristic of producing pulses, the frequency of which varies linearly with the amplitude of the unknown analog signal. The VCO need not display long term stability; however, the short term stability of the VCO should be high enough to complete several conversions between calibration cycles. The self-calibrating feature of this ADC permits the use of a low-cost VCO and still provides conversions to any desired accuracy within the theoretical limits of the components.

The counting means 10, 12 may comprise any suitable bidirectional counting device and the counters may be either binary counters or decade counters depending upon the application of the ADC. In the embodiment illustrated counting means 10, 12 comprise bidirectional counting registers with zero in the middle of the counting range. Clock pulse-generating means 20 may comprise any suitable device for producing pulses at an accurately known frequency. In the embodiment shown in the drawings, pulse-generating means 20 comprises a crystal oscillator.

Register means 26, 28 may comprise any suitable digital register devices for selectively storing digital data. Register means 26, 28 may comprise wired registers or in cases in which the ADC is part of a data-processing system, register means 26, 28 may comprise part of the storage of the computer.

Control means 30 comprises any suitable apparatus for providing the necessary control signals. When the ADC is associated with a data-processing system the necessary control signals can be supplied by the computer. Control means 30 may also comprise special purpose digital logic circuits. In this case a plurality of latches and associated logic circuits is provided to step through the proper sequence of events. Control means 30 may also be a mechanically operated device with as a rotary switch.

Control signals CONVERT and CALIBRATE are provided to start the respective operation. These control signals can be generated by any suitable means. One suitable means is from an associated data processing system and another suitable means is from built-in circuits. The CALIBRATE signal may be generated periodically on the basis of a timed interval. The signals may also be generated by manually activated switches.

Calibration is accomplished in response to the signal CALIBRATE by using only the components of the ADC. Calibration is accomplished by first setting in count 13 a factor representing a nominal span calibration factor. This factor may be derived from a theoretical count value, from a previous calibration or even from a guess. The self-calibrating feature will work even though the stored value is grossly different from the true calibration factor. For example, if the VCO 14 produces nominally 1 kilocycle pulses when zero voltage is applied and nominally 2 kilocycles when full scale voltage is applied, then the nominal span is 1,000 and this value is set into counter 12. It is recognized that the VCO operating frequencies would normally be much higher than those stated so that conversions could be accomplished in a faster time. However, the above example is given for convenience in describing an example.

A first reference voltage which in the embodiment shown is zero voltage input is then connected to VCO 14 by energizing gating means 32 with a suitable control signal from control means 30. At the same time, gating means 18 is energized so that counter 10 is counted down. Gating means 24 is energized so that counting means 12 is also counted down responsive to pulses from oscillator 20 from the value set in the counter for a predetermined time. The predetermined time can be conveniently chosen as the time required for counter 12 to reach a reference level which in the embodiment shown is zero as determined by zero detector means 38. At this time, the appropriate gates 18 and 24 are deenergized so that no further counting takes place.

The second reference voltage of full scale voltage is then coupled to the input of the VCO by gating means 34 while counter 10 is set to count up by energizing gating means 16. Counter 12 is also counted up by energizing gating means 22 so that pulses from oscillator 20 are gated to counter 12. This operation continues until a predetermined count is reached in counter 10. In the embodiment shown, the predetermined value is 1,000 and this is sensed by detector means 40. Upon the occurrence of the 1,000 count in counter 10, gating means 16 and 22 are deconditioned by termination of the signal from control means 30 so that further counting is inhibited. The count in counter 12 is then transferred to register means 28 by placing a suitable signal on line 42 which is operative to condition AND-gates 44 to transfer the value in counter 12 to register 28. Counter 10 is then reset to zero and gating means 32 is again energized so that the zero voltage input is connected to VCO 14. Gating means 18 and 24 are energized so that both counting means 10 and 12 are counted down. This counting continues until counter 12 reaches zero at which time counting stops.

The next step in the operation is to energize gating means 34 to connect full scale voltage to the input of VCO 14. Gating means 16 and 22 are energized to count both counters 10 and 12 up and this continues until the count in counting means 10 reaches 1,000 . At this time, a comparison is made by compare means 46 of the count then in counting means 12 and the count previously stored in register means 28. If the ADC is properly calibrated, the count values are the same within the desired tolerance. This comparison is accomplished by comparing enough stages of the count in counter 12 and register means 28 to provide the desired accuracy in the conversion. If the ADC has been previously calibrated, in almost all cases a single cycle will suffice to provide the calibration of the ADC. However, on the initial calibration, additional iterative cycles may be required to provide the proper calibration for the ADC. In this case, no compare is generated from compare means 46. When this occurs, the value in counting means 12 is then transferred into storage register means 28 for use in the next cycle of calibration for the ADC. The previously mentioned steps are repeated until the required accuracy is achieved for the span calibration span. When this is achieved, the span calibration factor is stored in storage register means 28.

The zero calibration factor is then produced by resetting the count in counter 10 to zero and energizing gating means 32 and 18 so that a zero voltage input is provided for the VCO 14 and counter 10 is counted down. This count continues until counter 12 is counted down to zero as determined by detector 38. The count then in counting means 10 is stored in storage register means 26 by coupling an appropriate control signal to line 48 to condition AND-circuits 49.

The ADC is then calibrated for usage to perform a conversion operation in response to a CONVERT signal. The zero offset factor stored in register means 26 is set into counting means 10 by means of a signal on line 50 to condition AND-circuits 51 and the span calibration factor is transferred from register means 28 to counting means 12 by means of a signal on line 52 to condition AND-circuits 53. Gating means 16, 24, and 36 are then energized to set counting means 10 to count up, counting means 12 to count down and to couple the variable analog voltage to the input of VCO 14. This counting operation continues until the counting means 12 is counted down to zero as determined by detector 38. At this time, counting means 10 contains the converted value of the unknown analog voltage.

To further illustrate the self-calibrating feature of the invention, a numerical example is presented. This numerical example assumes that the particular VCO 14 does not operate at its nominal frequencies as previously stated for a given voltage input but operates at a frequency of 900 pulses for a zero voltage input and a frequency of 1,800 pulses for a full scale voltage input. The calibration is started by loading the nominal span calibration count of 1,000 in counting means 12. Assuming that the crystal oscillator frequency is 1 kc. counter 12 is counted down to zero in 1 second during which time counter 10 is counted down to −900. The next step in the calibration is to connect the full scale voltage input to VCO 14 and count counters 10 and 12 up until counter 10 reaches 1000. Since the VCO counts at the rate of 1,800 pulses per second for the full scale input, a time of 1.055 seconds elapses so that the count in counter 12 is 1,055. This factor is stored in register means 28.

Counter 10 is then reset to zero and the zero input voltage is connected to the input of VCO 14 and both counters 10 and 12 are set to count down. The counters are counted until counter 12 reaches zero. Since the counter 12 was operated for 1.055 seconds the count in counter 10 at that time is −949. The full scale voltage input is then connected to VCO 14 and counters 10 and 12 are set to count up. The counters count up until counter 10 reaches a count of 1,000. Since the VCO is counting at a rate of 1,800 pulses per second, this takes 1.083 seconds which results in a count of 1,083 in counter 12. This count is then compared with the count 1,055 previously stored in register means 28. If the values are the same within the desired accuracy, the span calibration factor has been achieved. However, in this case, the counts differ by 2.8 percent so that another cycle appears necessary.

The cycle is commenced by storing the value of 1,083 from counter 12 into register means 28 to replace the previously stored factor of 1,055. Registers 10 and 12 are counted down with the zero input coupled to VCO 14 until the count in counter 12 reaches zero. Since this count is for a period of 1.083 seconds, the count in counter 10 is then −974. Then with the full scale voltage input to the VCO, the counters 10 and 12 are counted up until counter 10 reaches 1,000. Since the VCO is producing pulses at the rate of 1,800 per second, the count to 1,000 requires 1.097 seconds which results in a count of 1,097 in counter 12. A comparison of this count and the previously stored count from register 28 shows that the error is 1.4 percent. Assuming that this accuracy is not sufficient, this count of 1,097 is transferred to register 28 to replace the previous factor and an additional cycle is performed. In this case, counter 10 is counted down for a period of 1.097 seconds so that the resulting count is −987. In counting counter 10 up to 1,000 with the full scale input to the VCO, this is accomplished in 1.103 seconds so that a count of 1,103 is then in counter 12. A comparison with the previously stored count shows that this represents a difference of 0.6 percent. Thus, it can be seen that the span calibration factor can be accomplished to any desired accuracy by means of the repetitive cycles of counting and storing the span calibration count.

Assuming that this latest count is within the desired accuracy, this count is stored in register 28 for use in all conversions until another calibration cycle is taken. Counter 10 is then reset to zero and the zero input voltage is connected to the VCO. Both counter 10 and 12 are then counted down until counter 12 reaches zero. Since this takes a time of 1.103 seconds, and the VCO produces pulses at a rate of 900 per second, a count of −992 is in counter 10. This count is the zero offset factor and this count is stored in register means 26 for use in future conversions. Thus, to perform a conversion on an unknown analog signal, the zero offset factor of −992 is transferred from register 26 to counter 10 and the span calibration factor of 1,103 is transferred from register 28 to counter 12. Counter 10 is then counted up for the time it takes for counter 12 to be stepped down to zero. The count in counter 10 then represents the converted value of the unknown analog signal. The FIGURES given in this example are chosen for ease of explanation of the operation and it is recognized that the frequency of the pulses will be a much higher frequency in most cases so that a conversion can be accomplished in a much shorter time.

While the invention has been particularly shown and described with reference to a preferred embodiment thereof, it will be understood by those skilled in the art that various changes in the form and details may be made therein without departing from the spirit and scope of the invention.

What is claimed is:

1. The method of generating a span calibration factor for a self-calibrating analog-to-digital converter utilizing first and second counting means comprising the steps of:

- setting a stored calibration count in the second counting means;
- counting pulses in the first counting means in a first direction at a variable rate determined by a first voltage source for a predetermined time;
- counting pulses in said first counting means in the opposite direction at a variable rate determined by a second voltage source until said first counting means reaches a predetermined count while simultaneously counting a second counting means at a fixed rate;
- comparing the count in said second counting means with the stored calibration count;
- repeating the above steps on the occurrence of a noncompare indication after replacing the stored calibration count with the count in said second counting means; and
- storing the count in the second counting means on the occurrence of a compare signal as the span calibration factor for use in subsequent conversion operations.

2. The method of generating a zero calibration factor in a self-calibrating analog-to-digital converter utilizing first and second counting means according to claim 1 comprising the additional steps of:

- storing the span calibration factor in said second counting means; and
- counting said first counting means in a first direction from a reference count at a variable rate determined by a first voltage source and simultaneously counting to said reference count in said second counting means the pulses produced by fixed rate pulses to produce the zero calibration factor in said first counting means when said second counting means reaches said reference count.

3. A self-calibrating analog-to-digital converter comprising:

- first and second digital counting means;
- pulse-producing means for producing a series of output pulses having a variable repetition rate dependent upon the amplitude of the input signal;
- means for producing pulses having a fixed repetition rate;
- a first and a second reference voltage source,
- means responsive to said first and second reference voltage sources for generating a span calibration factor in said second counting means;
- means responsive to said span calibration factor and said first reference voltage source for generating a zero calibration factor in said first counting means;
- means for connecting an analog signal of unknown magnitude to said pulse-producing means; and
- means for connecting the pulses from said pulse-producing means to count said first counting means for the time required for said fixed rate pulses to count said second counting means to a reference count whereby the count then in said first counting means is the digital representation of said analog signal.

4. The apparatus according to claim 3 wherein said means for generating a span calibration factor in said second counting means comprises:

- a digital storage means;
- means for transferring a stored calibration count to said second counting means;
- means for connecting for a predetermined time said first counting means to count in a first direction said pulses produced by connecting said first voltage source to said pulse-producing means for a predetermined time;
- means for connecting said first counting means to count in the other direction to a predetermined count said pulses produced by connecting a second voltage source to said pulse-producing means and simultaneously counting in said second counting means the fixed rate pulses;
- means for comparing the count in said second counting means with said calibration count;
- means in response to a noncompare indication for repeating the calibration after storing in said digital storage means as a new calibration count the count then in said second counting means; and
- means for terminating said span calibration operation on a compare indication whereby said span calibration factor is the count in the second counting means at the time said first counting means reaches the predetermined count.

5. The apparatus according to claim 3 wherein said means for generating a zero calibration factor in said first counting means comprises:

- means for storing the span calibration factor in said second counting means;
- means for connecting said first counting means to count in a first direction from a reference count said pulses produced by connecting the first voltage source to said pulse-producing means while simultaneously counting to said reference count in said second counting means in said first direction the fixed rate pulses whereby the zero calibration factor is the count in said first counting means when said second counting means reaches said reference count.

6. The apparatus according to claim 3 wherein said first reference voltage is zero volts and said second reference voltage is full scale voltage.

* * * * *